(12) United States Patent
Kimura

(10) Patent No.: US 7,973,595 B2
(45) Date of Patent: Jul. 5, 2011

(54) POWER SWITCH CIRCUIT

(75) Inventor: Hiroyuki Kimura, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 39 days.

(21) Appl. No.: 12/563,174

(22) Filed: Sep. 21, 2009

(65) Prior Publication Data
US 2011/0068851 A1   Mar. 24, 2011

(51) Int. Cl.
*H02M 1/10* (2006.01)
(52) U.S. Cl. .......................... 327/547; 327/530
(58) Field of Classification Search .............. 327/423, 327/424, 494, 588, 407–410, 530, 547
See application file for complete search history.

(56) References Cited

U.S. PATENT DOCUMENTS

| | | | | |
|---|---|---|---|---|
| 5,341,034 | A * | 8/1994 | Matthews | 327/534 |
| 5,510,735 | A * | 4/1996 | Mahabadi | 327/77 |
| 6,421,261 | B1 * | 7/2002 | Fujisawa et al. | 363/127 |
| 6,642,750 | B1 * | 11/2003 | Egan | 327/63 |
| 7,286,005 | B2 * | 10/2007 | Jiang et al. | 327/547 |
| 7,362,161 | B2 * | 4/2008 | Sone | 327/530 |
| 7,443,199 | B2 | 10/2008 | da Fonte Dias et al. | 326/68 |

FOREIGN PATENT DOCUMENTS

| | | |
|---|---|---|
| JP | 06-012876 A | 1/1994 |
| JP | 2008-086100 A | 4/2008 |

* cited by examiner

*Primary Examiner* — Hai L Nguyen
(74) *Attorney, Agent, or Firm* — Charles Bergere

(57) ABSTRACT

A power switch circuit includes a first switch transistor connected to a main power supply, which supplies a first voltage, a second switch transistor connected in series to the first switch transistor and to a backup power supply, which supplies a second voltage. A switch control unit controls activation and deactivation of the first and second switch transistors so that either one of a voltage corresponding to the first voltage and a voltage corresponding to the second voltage is selectively output to a connection node between the first and second transistors. The first switch transistor includes a first diode, which is formed so that a direction from the main power supply toward the connection node defines a forward direction, and a second diode, which is formed so that a direction from the connection node toward the backup power supply defines a forward direction.

7 Claims, 3 Drawing Sheets

POWER SWITCH CIRCUIT

BACKGROUND OF THE INVENTION

The present invention relates to a power switch circuit that switches the power supply for a device between a main power supply and a backup power supply.

An electronic device generally includes a main power supply, which supplies power voltage to a load (internal circuit), and a backup power supply, which is for maintaining the operation of a memory or the like to backup data. The backup power supply functions not only when the main power supply is not used but also when the voltage of the main power supply becomes low to supply the load with operational voltage and maintain the function of the electronic device. Normally, the maximum supply capacity (maximum voltage value) of a backup power supply is set to be lower than the maximum supply capacity (maximum voltage value) of a main power supply.

Japanese Laid-Open Patent Publication No. 6-12876 describes a prior art example of a power switch circuit. The power switch circuit illustrated in FIG. 6 of the publication includes a first transistor, which is formed by a MOS transistor and connected between a main power supply and an output terminal, and a second transistor, which is also formed by a MOS transistor and connected between a backup power supply and the output terminal. The power switch circuit activates the first transistor and deactivates the second transistor to output the voltage of the main power supply to the output terminal. Further, the power switch circuit deactivates the first transistor and activates the second transistor to output the voltage of the backup power supply to the output terminal. This prior art structure, however, has a shortcoming in that current leaks out of the backup power supply if the voltage of the main power supply becomes lower than the voltage of the backup power supply when the main power supply is selected. Under such a situation, the potential at the output terminal becomes lower than the voltage of the backup power supply due to the active first transistor. The leakage occurs as current flows from the backup power supply to the output terminal via a body diode formed in the second transistor. When current leaks out of the backup power supply, the voltage required for operations using the backup power supply, such as data backup, becomes insufficient. This may result in the loss of data. Such a decrease in the supply capacity of the backup power supply may significantly affect the operation of a device.

Japanese Laid-Open Patent Publication No. 2008-86100 discusses a solution to such a current leakage problem. In the publication, two MOS transistors are connected in series between a backup power supply and an output terminal. Further, the back gates of the MOS transistors are connected to each other so that the forward bias direction of each body diode is reversed from that of the other body diode (refer to FIG. 2 of the publication). To facilitate the description hereafter, the connection structure of the two MOS transistors is referred to as a back-to-back (BTB) connection structure. Employment of the BTB connection structure prevents leakage current from flowing from the backup power supply via a BTB connection element even if the main power supply voltage (i.e., potential at the output terminal) becomes lower than the backup power supply voltage. However, as would be understood by one skilled in the art, the BTB connection structure not only causes complications when mounted on an IC chip but also occupies a relatively large layout area in the limited chip region. Accordingly, the BTB connection structure is at least not preferable from the viewpoint of IC mounting.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
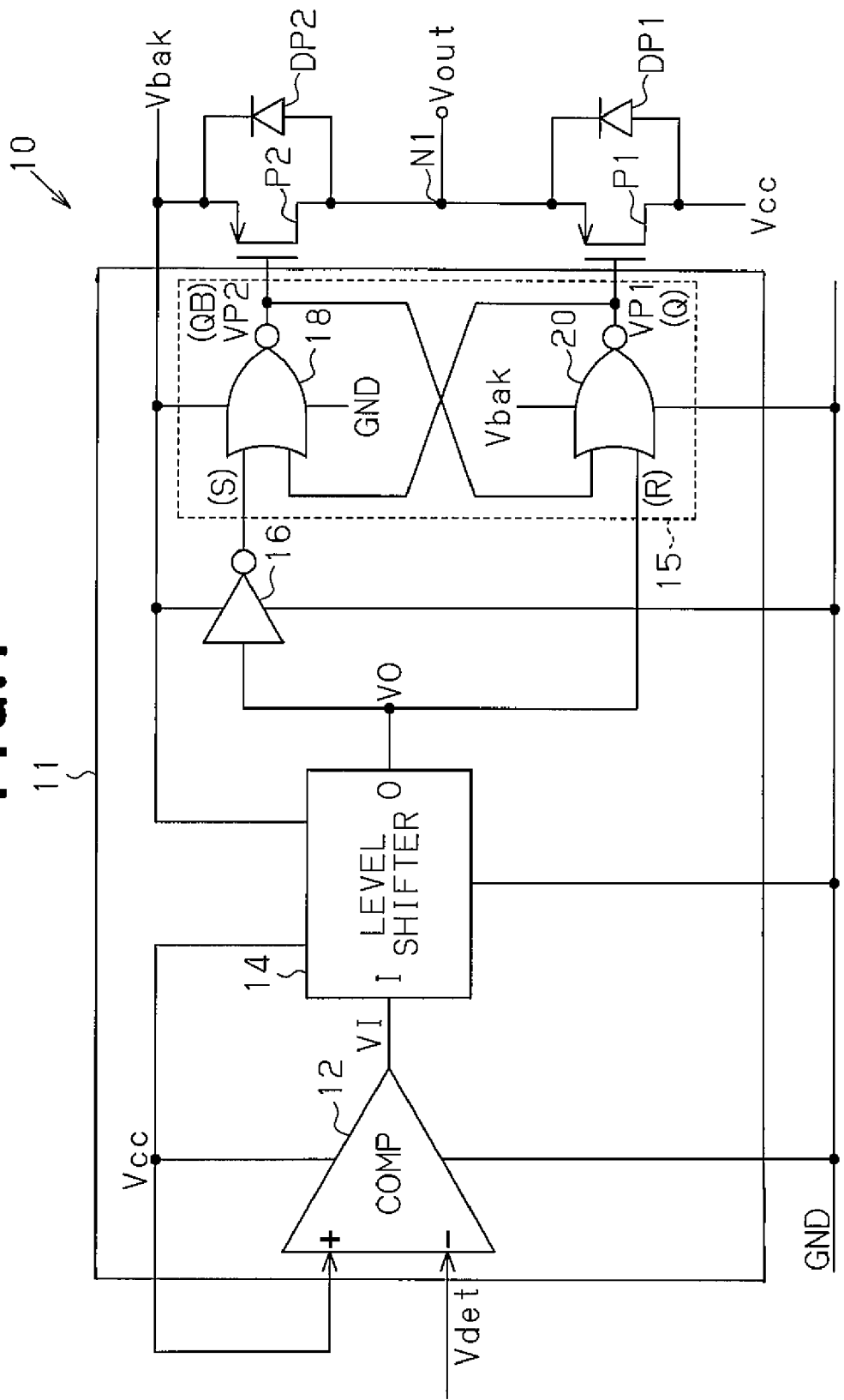
FIG. 1 is a schematic circuit diagram showing a preferred embodiment of a power switch circuit.

In the drawings, like numeral are used for like elements throughout.

The present invention provides a power switch circuit having a simple structure that prevents the supply capacity of a backup power supply from decreasing.

One aspect of the present invention is a power switch circuit. A first switch transistor connected to a main power supply supplies a first voltage. A second switch transistor is connected in series to the first switch transistor and to a backup power supply which supplies a second voltage. A switch control unit controls activation and deactivation of the first and second switch transistors so that either one of a voltage corresponding to the first voltage and a voltage corresponding to the second voltage is selectively output to a connection node between the first and second transistors. The first switch transistor includes a first diode, which is formed so that a direction from the main power supply toward the connection node defines a forward direction. The second switch transistor includes a second diode, which is formed so that a direction from the connection node toward the backup power supply defines a forward direction.

A further aspect of the present invention is a power switch circuit. A first switch transistor is connected between a main power supply and an output node to output a first voltage supplied from the main power supply to the output node. The first switch transistor is further connected to a first diode. The first diode is formed in a direction which prevents leakage current from flowing from the output node to the main power supply when the first switch transistor is deactivated. A second switch transistor is connected between a backup power supply and the output node to output a second voltage supplied from the backup power supply to the output node. The second switch transistor is further connected to a second diode. The second diode is formed in a direction which prevents leakage current from flowing from the backup power supply to the output node when the second switch transistor is deactivated. A switch control unit activates and deactivates the first and second switch transistors in a substantially complementary manner.

Other aspects and advantages of the present invention will become apparent from the following description, taken in conjunction with the accompanying drawings, illustrating by way of example the principles of the invention.

A preferred embodiment of a power switch circuit 10 will now be discussed with reference to the drawings. As shown in FIG. 1, the power supply switch circuit 10 includes a first switch transistor P1, which is connected to a main power supply that supplies voltage Vcc, and a second switch transistor P2, which is connected to a backup power supply that supplies voltage Vbak. The first and second switch transistors P1 and P2 are each formed by a P-channel MOS transistor and connected in series to each other. The power switch circuit 10 controls the activation and deactivation of the first and second switch transistors P1 and P2 to selectively output one of the voltages Vcc and Vbak as an output voltage Vout from a connection node N1 between the first and second switch transistors P1 and P2. The output voltage Vout is supplied as a power supply voltage to a load (internal circuit) that is not shown in the drawings. The main power supply has a maximum supply capacity that is greater than the maximum supply capacity of the backup power supply.

The first switch transistor P1 includes a source connected to the connection node N1, a drain connected to the main power supply, and a gate responsive to a first switch signal VP1. The first switch transistor P1 further includes a first diode DP1 formed between the main power supply and the connection node N1 so that the direction from the drain toward the source in the first switch transistor P1 is the forward direction. In the preferred embodiment, the first diode DP1 is a body diode (hereinafter, referred to as the body diode DP1) formed in the first switch transistor P1.

The second switch transistor P2 includes a source connected to the backup power supply, a drain connected to the connection node N1, and a gate responsive to a second switch signal VP2. The second switch transistor P2 further includes a second diode DP2 formed between the backup power supply and the connection node N1 so that the direction from the drain toward the source in the second switch transistor P2 is the forward direction. In the preferred embodiment, the second diode DP2 is a body diode (hereinafter, referred to as the body diode DP2) formed in the second switch transistor P2.

The power switch circuit 10 further includes a comparator 12, which compares the level of the voltage Vcc with a reference voltage Vdet and generates a comparison result signal VI. The reference voltage Vdet is used to determine whether the voltage Vcc has become lower than a predetermined level. For example, the predetermined level is set at a voltage value that sufficiently activates the first switch transistor P1. The reference voltage Vdet may be generated in the power switch circuit 10 or be supplied from an external circuit (not shown). When the voltage Vcc is greater than or equal to the reference voltage Vdet, the comparator 12 generates the comparison result signal VI with an H level (Vcc level). When the voltage Vcc is lower than the reference voltage Vdet, the comparator 12 generates the comparison result signal VI with an L level (ground level).

A level shifter 14 is connected to an RS flip-flop (hereinafter, the RSFF) 15, which serves as a switch signal generation unit and includes a first NOR gate 18 and a second NOR gate 20. The first NOR gate 18 includes a first input terminal, which serves as an S terminal of the RSFF 15 connected to an output terminal of the level shifter 14 via an inverter 16, a second input terminal, which is connected to a Q terminal of the RSFF 15, and an output terminal, which serves as a QB ("inverted Q") terminal of the RSFF 15. The second NOR gate 20 includes a first input terminal, which serves as an R terminal of the RSFF 15 connected to the output terminal of the level shifter 14, a second input terminal connected to the QB terminal of the RSFF 15, and an output terminal serving as the Q terminal of the RSFF 15. The first NOR gate 18, the second NOR gate 20, and the inverter 16 are supplied with the voltage Vbak of the backup power supply that serves as an operational voltage. In the preferred embodiment, the comparator 12, the level shifter 14, the inverter 16, and the RSFF 15 form a switch control unit 11.

When a logic control signal V0 input to the S terminal of the RSFF 15 has an H level (in this case, the logic control signal V0 input to the R terminal has an L level), the RSFF 15 generates a first switch signal VP1 having an H level at the Q terminal and a second switch signal VP2 having an L level at the QB terminal. This deactivates the first switch transistor P1 and activates the second switch transistor P2. Accordingly, the voltage Vbak of the backup power supply is output as the output voltage from the connection node N1.

When the logic control signal V0 input to the S terminal of the RSFF 15 has an L level (in this case, the logic control signal V0 input to the R terminal has an H level), the RSFF 15 generates the first switch signal VP1 with an L level at the Q terminal and the second switch signal VP2 with an L level at the QB terminal. This deactivates the second switch transistor P2 and activates the first switch transistor P1. Accordingly, the voltage Vcc of the main power supply is output as the output voltage Vout from the connection node N1.

The power switch circuit 10 selects the voltage Vcc of the main power supply as the output voltage Vout when the voltage Vcc is greater than or equal to the reference voltage Vdet. Further, the power switch circuit 10 selects the voltage Vbak of the backup power supply as the output voltage Vout when the voltage Vcc of the main power supply is less than the reference voltage Vdet.

Figure 2:
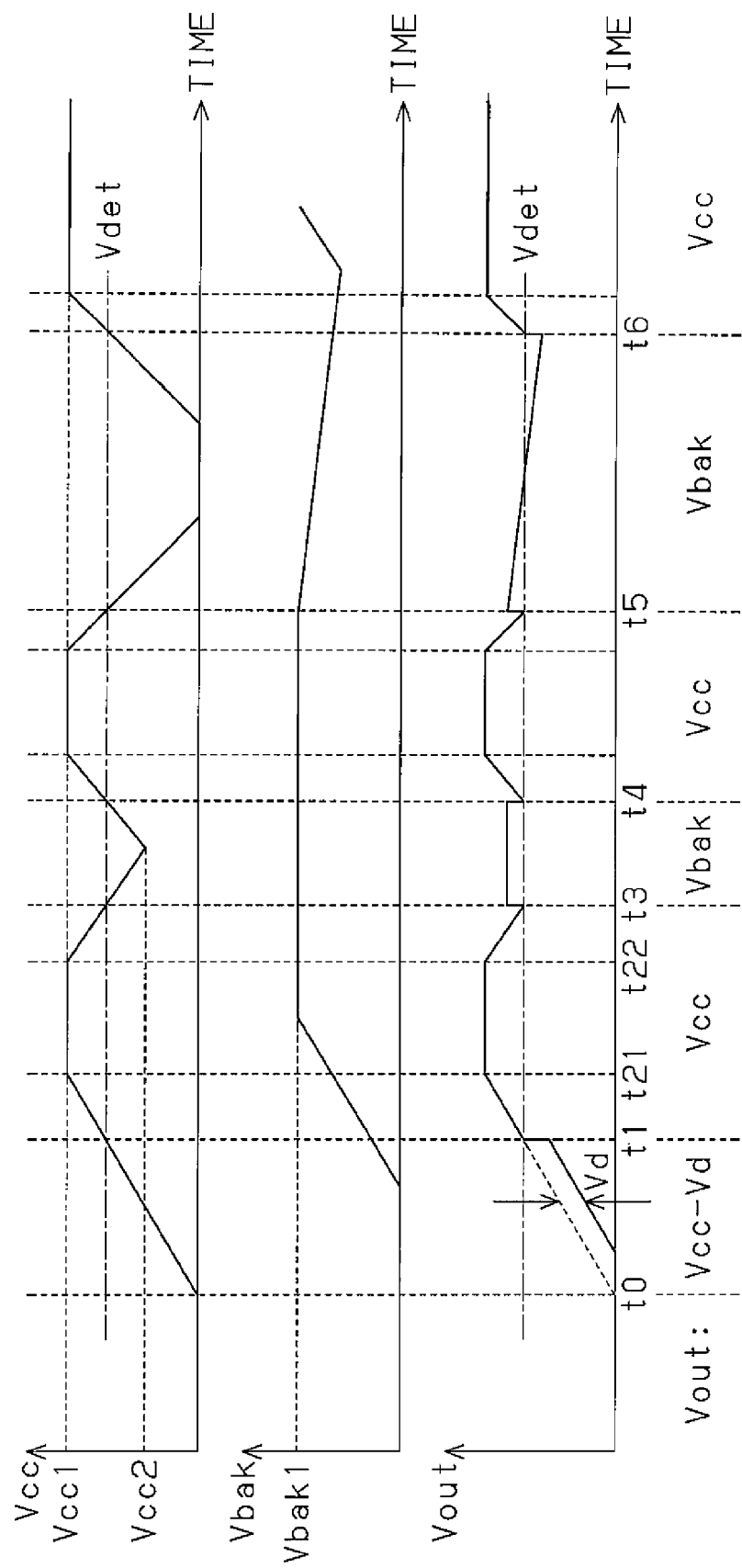
FIG. 2 is a schematic timing chart illustrating an operation performed by the power switch circuit of FIG. 1 to switch between a main power supply and a backup power supply.

Transition of the level of the output voltage Vout in accordance with the switching of the main power supply and the backup power supply will now be discussed with reference to FIG. 2.

At time t0, the main power supply goes on, and the power switch circuit 10 is activated. The voltage Vcc starts to rise from 0 V. When the power switch circuit 10 is activated, the voltage Vbak of the backup power supply is also 0 V. Thus, after the voltage Vcc increases to a predetermined voltage, the voltage Vbak starts to rise from 0V.

At time t1, the voltage Vcc reaches the reference voltage Vdet. During the period of time t0 to time t1, the voltage Vcc is less than the reference voltage Vdet. Thus, the first switch transistor P1 cannot be activated. Likewise, the voltage Vbak does not reach a sufficient level for activating the second switch transistor P2. Accordingly, the switch transistors P1 and P2 are both deactivated. However, during this period, current flows from the main power supply via the body diode D1 to the connection node N1. Thus, the output voltage Vout may be represented as the difference between the voltage Vcc of the main power supply and a drop voltage Vd at the body diode D1. Accordingly, the value of the output voltage Vout is not indefinite.

When the voltage Vcc reaches the reference voltage Vdet (time t1), the logic control signal V0 provided to the S terminal of the RSFF 15 has an L level, and the logic control signal V0 provided to the R terminal of the RSFF 15 has an H level. In response, the RSFF 15 generates the first switch signal VP1 with an L level to activate the first switch transistor P1 and generates the second switch signal VP2 with an H level to deactivate the second switch transistor P2. Accordingly, the power switch circuit 10 selects the voltage Vcc of the main power supply as the output voltage Vout. Then, at time t21, the voltage Vcc reaches the maximum value Vcc1. The voltage Vcc is output at the maximum value Vcc1 over a predetermined period, for example, during the period of time t21 to t22.

At time t3, the voltage Vcc decreases to less than the reference voltage Vdet. In this state, the logic control signal V0 is provided to the S terminal of the RSFF 15 with an H level, and the logic control signal V0 provided to the R terminal of the RSFF 15 has an L level. In response, the RSFF 15 generates the first switch signal VP1 with an H level to deactivate the first switch transistor P1 and generates the second switch signal VP2 with an L level to activate the second switch transistor P2. Accordingly, the power switch circuit 10 selects the voltage Vbak of the backup power supply as the output voltage Vout. For example, the output voltage Vout is output at the maximum value Vbak1 of the voltage Vbak that is set to be lower than the maximum value Vcc1 of the voltage Vcc. Then, the voltage Vcc of the main power supply decreases to a predetermined level (Vcc2 level in FIG. 2). However, when the backup power supply is selected, the output voltage Vcc is output at the level of the voltage Vbak.

At time t4, the voltage Vcc reaches the reference voltage Vdet. Therefore, in the same manner as time t1, the power switch circuit 10 selects the voltage Vcc of the main power supply as the output voltage Vout. Then, at time t5, the voltage Vcc decreases to less than the reference voltage Vdet. Accordingly, in the same manner as time t3, the power switch circuit 10 selects the voltage Vbak of the backup power supply as the output voltage Vout. FIG. 2 illustrates a case in which, for example, the main power supply is deactivated shortly before time t5. In this case, the power switch circuit continuously uses the backup power supply.

After the main power supply is activated again, at time t6, the voltage Vcc reaches the reference voltage Vdet again. Accordingly, in the same manner as time t1 and time t4, the power switch circuit 10 selects the voltage Vcc of the main power supply as the output voltage Vout.

Figure 3:
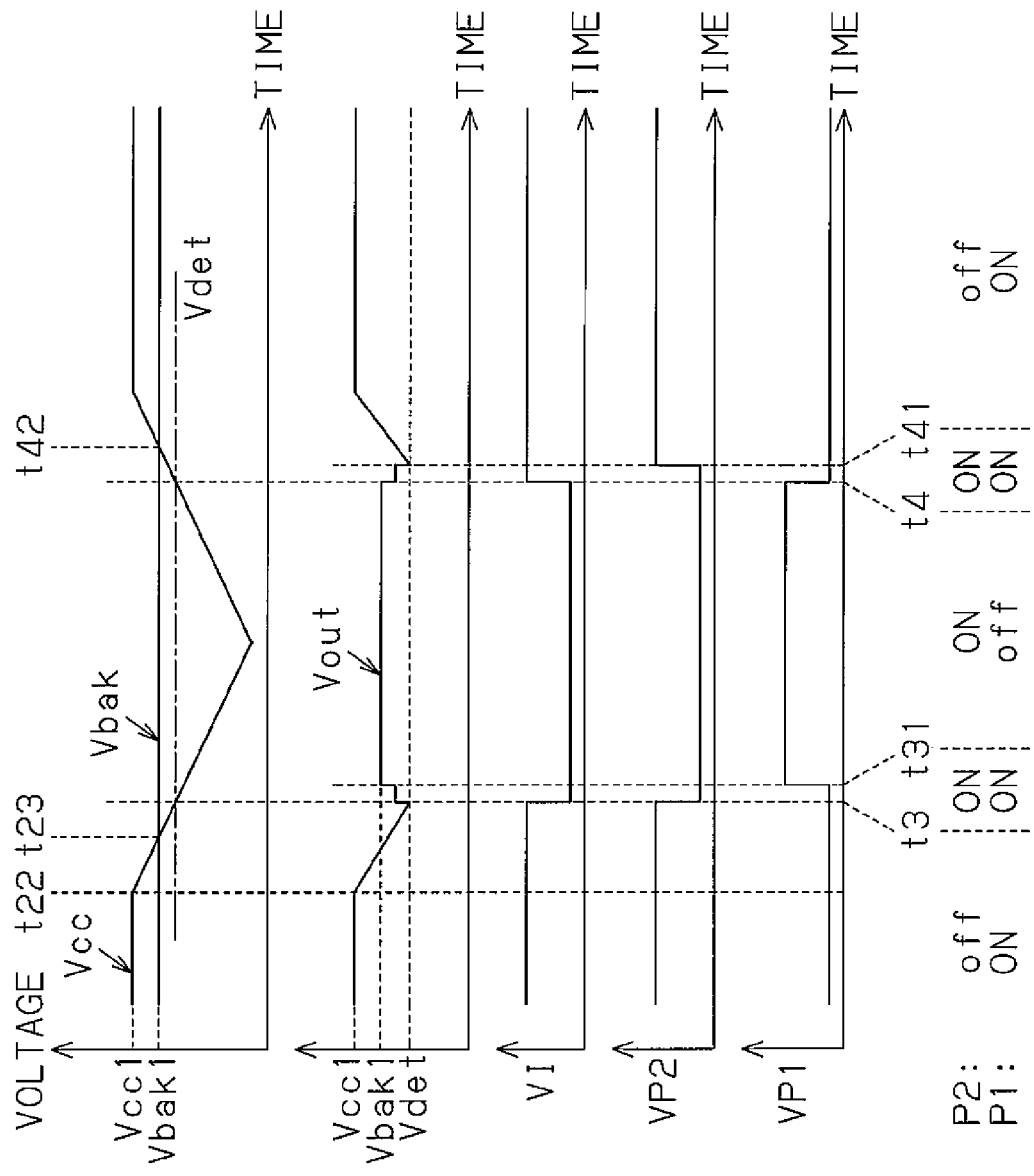
FIG. 3 is a schematic timing chart illustrating part of the power supply switching operation of FIG. 2 together with the operation of two switch transistors.

Referring to FIG. 3, the correlation of the power supply switching operation and the supply capacity of the backup power supply will now be discussed. FIG. 3 is a timing chart showing the power supply switching operation at and around time t3 to time t4 of FIG. 2.

At time t22, the voltage Vcc of the main power supply starts to decrease. Then, at time t23, which is shortly before time t3, the voltage Vcc (output voltage Vout) becomes the same level as the voltage Vbak. As shown in FIG. 3, the reference voltage Vdet (determination level for the voltage Vcc) is set to be lower than the maximum value Vbak1 of the voltage Vbak, or the maximum supply capacity of the backup power supply. When the voltage Vcc is higher than the voltage Vbak, the output voltage Vout, which has the same level as the voltage Vcc due to the first switch transistor P1, is also higher than the voltage Vbak. Accordingly, when using the main power supply, the body diode D2 is forward biased. Thus, current flows from the connection node N1 to the backup power source. However, this leakage does not affect the operation of the device on which the power switch circuit 10 is mounted but rather functions to increase the voltage level of the backup power supply.

At time t3, the voltage Vcc (output voltage Vout) decreases to less than the reference voltage Vdet. During the period of time t23 to t3, the voltage Vbak is higher than the voltage Vcc (output voltage Vout). However, the body diode D2 is reverse biased. This prevents current from leaking out of the backup power supply to the connection node N1 via the body diode D2. Therefore, the supply capacity of the backup power supply does not decrease.

As shown in FIG. 3, at time t3, the second control signal VP2 falls to the L level at substantially the same time as when the comparison result signal V1 of the comparator 12 falls to the L level. The L level second control signal VP2 raises the first control signal VP1 to the H level (time t31). In other words, there is a delay in the shifting of the first control signal VP1 from an L level to an H level. The delay maintains the first switch transistor P1 in an activated state. During the period of time t3 to t31, the first and second switch transistors P1 and P2 are both activated. In this state, the voltage Vbak is higher than the voltage Vcc. Thus, current flows from the backup power supply to the main power supply via the second switch transistor P2 and the first switch transistor P1, and the output voltage Vout becomes slightly lower than the voltage value Vbak1. However, the delay period (time t3 to time t31) is extremely short. Accordingly, the decrease in the supply capacity of the backup power supply is subtle such that it does not affect device operations. Moreover, there is a period in which the first and second switch transistors P1 and P2 are both activated. This prevents momentary blackout of the output voltage Vout.

When the first control signal VP1 rises to an H level, the first switch transistor P1 is deactivated (time t31). Accordingly, the level of the output voltage Vout is shifted from the level of the voltage Vcc (main power supply) to the level of the voltage Vbak (backup power supply). Afterwards, the backup power supply is used until the voltage Vcc increases to the reference voltage Vdet or greater. In FIG. 3, the voltage Vcc reaches the reference voltage Vdet at time t4.

During the period of time t31 to time t4, the voltage Vbak (output voltage Vout) is higher than the voltage Vcc. Accordingly, the body diode D1 is reverse biased. This prevents the current of the backup power supply from leaking from the connection node N1 via the body diode D1. Thus, the supply capacity of the backup power supply does not decrease.

As shown in FIG. 3, at time t4, the first control signal VP1 falls to an L level at substantially the same time as when the comparison result signal V1 of the comparator 12 rises to an H level. The L level first control signal VP1 raises the second control signal VP2 to the H level (time t41). In other words, there is a delay in the shifting of the second control signal VP2 from an L level to an H level. The delay maintains the second switch transistor P2 in an activated state. During the period of time t4 to t41, the first and second switch transistors P1 and P2 are both activated. In this state, the voltage Vbak is higher than the voltage Vcc. Thus, current flows from the backup power supply to the main power supply via the second switch transistor P2 and the first switch transistor P1, and the output voltage Vout becomes slightly lower than the voltage value Vbak1. However, the delay period (time t4 to time t41) is extremely short. Accordingly, the decrease in the supply capacity of the backup power supply is subtle such that it does not affect device operations. Moreover, there is a period in which the first and second switch transistors P1 and P2 are both activated. This prevents momentary blackout of the output voltage Vout.

When the second control signal VP2 rises to an H level, the second switch transistor P2 is deactivated (time t41). Accordingly, the level of the output voltage Vout is shifted from the level of the voltage Vbak (backup power supply) to the level of the voltage Vcc (main power supply). Afterwards, the level of the voltage Vcc (output voltage Vout) becomes the same as the voltage Vbakt at time t42.

During the period of time t41 to time t42, the voltage Vbak is higher than the voltage Vcc (output voltage Vout). However, the body diode D1 is reverse biased. This prevents current from leaking out of the backup power supply to the connection node N1 via the body diode D2. Thus, the supply capacity of the backup power supply does not decrease.

In the preferred embodiment, the power switch circuit 10 has the advantages described below.

(1) The body diode DP2 prevents leakage current from flowing from the backup power supply to the connection node N1 when the second switch transistor P2 is deactivated. Thus, when the main power supply is in use, the supply capacity of the backup power supply is not decreased by a current leakage.

(2) The body diode DP1 prevents leakage current from flowing from the connection node N1 to the main power supply when the first switch transistor P1 is deactivated. Thus, when the backup power supply is in use, the supply capacity of the backup power supply is not decreased in an unnecessary manner by a current leakage.

(3) The power switch circuit 10 allows for switching between the backup power supply and the main power supply with the two switch transistors P1 and P2. This facilitates the mounting of the power switch circuit 10 on an IC chip.

(4) The power switch circuit 10 determines the level of the voltage Vcc with the single comparator and generates the first and second switch signals VP1 and VP2. Thus, the power switch circuit 10 has an extremely simple structure.

It should be apparent to those skilled in the art that the present invention may be embodied in many other specific forms without departing from the spirit or scope of the invention. Particularly, it should be understood that the present invention may be embodied in the following forms.

(A) The first and second diodes DP1 and DP2 are not restricted to body diodes. A "diode" may be a diode element connected to each switch transistor.

(B) Instead of the main power supply, the backup power supply may be connected to the comparator 12. In this case, in accordance with the level of the voltage Vcc, the comparator 12 generates the comparison result signal VI having either one of the level of the voltage Vbak and the ground level. In this structure, the comparison result signal VI may be used as the logic control signal V0. Thus, the level shifter 14 may be eliminated.

(C) The switch signal generation unit that generates the first and second switch signals VP1 and VP2 is not limited to the RSFF 15 and other circuits may be used.

(D) The first and second switch transistors P1 and P2 may each be an N-channel MOS transistor.

The present examples and embodiments are to be considered as illustrative and not restrictive, and the invention is not to be limited to the details given herein, but may be modified within the scope and equivalence of the appended claims.

What is claimed is:

1. A power switch circuit, comprising:
a first switch transistor connected to a main power supply that supplies a first voltage;
a second switch transistor connected in series to the first switch transistor and to a backup power supply that supplies a second voltage; and
a switch control unit that controls activation and deactivation of the first and second switch transistors so that a voltage corresponding to one of the first voltage and the second voltage is selectively output to a connection node between the first and second transistors;
wherein the first switch transistor includes a first diode, which is formed so that a direction from the main power supply toward the connection node defines a forward direction, and the second switch transistor includes a second diode, which is formed so that a direction from the connection node toward the backup power supply defines a forward direction, and
wherein the switch control unit includes:
a comparator, connected to the main power supply, that compares a level of the first voltage with a reference voltage and generates a comparison result signal having one of a level of the first voltage and a ground level in accordance with the level of the first voltage;
a switch signal generation unit that generates first and second switch signals respectively controlling the first and second switch transistors; and
a level shifter, connected to the main power supply and the backup power supply, that generates a logic control signal having one of a level of the second voltage and the ground level in accordance with the level of the comparison result signal, and
wherein the switch signal generation unit generates the first and second switch signals in accordance with the level of the logic control signal.

2. The power switch circuit according to claim 1, wherein:
the first diode is a body diode of the first switch transistor; and
the second diode is a body diode of the second switch transistor.

3. The power switch circuit according to claim 1, wherein the switch signal generation unit is an RS flip-flop.

4. The power switch circuit according to claim 1, wherein the switch control unit switches the first and second switch transistors in a substantially complementary manner, with the transistors both being momentarily activated during the switching of the two transistors.

5. The power switch circuit according to claim 1, wherein each of the first and second switch transistors is a MOS transistor.

6. A power switch circuit, comprising:
a first switch transistor, connected between a main power supply (Vcc) and a connection node, that supplies a first voltage;
a first diode connected in parallel to the first switch transistor such that a direction from the main power supply toward the connection node defines a forward direction thereof;
a second switch transistor, connected in series to the first switch transistor and to a backup power supply (Vbak), that supplies a second voltage, wherein the connection node is located between the first and second switch transistors;
a second diode connected in parallel to the second switch transistor such that a direction from the connection node toward the backup power supply defines a forward direction thereof, and
a comparator that compares a level of the first voltage with a reference voltage (Vdet) and generates a comparison result signal;
a level shifter, connected to the main power supply and the backup power supply, that generates a logic control signal having one of a level of the second voltage and a ground level in accordance with the comparison result signal
a switch signal generation unit that generates first and second switch signals that respectively control activation and deactivation of the first and second switch transistors such that one of the first and second voltages is selectively output at the connection node, wherein the switch signal generation unit generates the first and second switch signals based on the level of the logic control signal.

7. The power switch circuit of claim 6, wherein the switch signal generation unit comprises a RS flip-flop.

* * * * *